United States Patent
Igarashi et al.

(10) Patent No.: US 9,698,195 B2
(45) Date of Patent: *Jul. 4, 2017

(54) METHOD FOR PRODUCING IMAGE PICKUP APPARATUS AND METHOD FOR PRODUCING SEMICONDUCTOR APPARATUS

(71) Applicant: OLYMPUS CORPORATION, Tokyo (JP)

(72) Inventors: Takatoshi Igarashi, Ina (JP); Noriyuki Fujimori, Suwa (JP); Kazuhiro Yoshida, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/994,581

(22) Filed: Jan. 13, 2016

(65) Prior Publication Data

US 2016/0126286 A1    May 5, 2016

Related U.S. Application Data

(63) Continuation of application No. 14/557,271, filed on Dec. 1, 2014, now Pat. No. 9,282,261, which is a
(Continued)

(30) Foreign Application Priority Data

May 30, 2012  (JP) .................................. 2012-123223

(51) Int. Cl.
*H01L 27/146* (2006.01)
*H01L 25/04* (2014.01)
(Continued)

(52) U.S. Cl.
CPC ...... *H01L 27/14698* (2013.01); *H01L 25/042* (2013.01); *H01L 27/1469* (2013.01);
(Continued)

(58) Field of Classification Search
None
See application file for complete search history.

(56) References Cited

U.S. PATENT DOCUMENTS 9,123,918 B2    9/2015  Tsutsumi et al.
2005/0099532 A1 *  5/2005  Tseng ................ H01L 27/14618
348/374
(Continued)

FOREIGN PATENT DOCUMENTS

CN    101079372 A    11/2007
CN    101449368 A    6/2009
(Continued)

OTHER PUBLICATIONS

Extended Supplementary Partial European Search Report dated Mar. 14, 2016 from related European Application No. 13 79 6612.3.
(Continued)

*Primary Examiner* — Seahvosh Nikmanesh
(74) *Attorney, Agent, or Firm* — Scully, Scott, Murphy & Presser, PC

(57) ABSTRACT

A method for producing an image pickup apparatus includes: a process of cutting an image pickup chip substrate where electrode pads are formed around each of the light receiving sections to fabricate image pickup chips; a process of bonding image pickup chips determined as non-defective products to a glass wafer to fabricate a joined wafer; a process of filling a sealing member among the image pickup chips on the joined wafer; a machining process including a thinning a thickness of the joined wafer to flatten a machining surface and a forming through-hole interconnections,
(Continued)

each of which is connected to each of the electrode pads; a process of forming a plurality of external connection electrodes, each of which is connected to each of the electrode pads via each of the through-hole interconnections; and a process of cutting the joined wafer.

3 Claims, 8 Drawing Sheets

Related U.S. Application Data continuation of application No. PCT/JP2013/060343, filed on Apr. 4, 2013.

(51) Int. Cl.
  *H04N 5/225* (2006.01)
  *H04N 5/335* (2011.01)
  *H01L 23/31* (2006.01)
(52) U.S. Cl.
  CPC .. *H01L 27/14618* (2013.01); *H01L 27/14625* (2013.01); *H01L 27/14685* (2013.01); *H01L 27/14687* (2013.01); *H04N 5/2254* (2013.01); *H04N 5/335* (2013.01); *H01L 23/3121* (2013.01); *H01L 2924/0002* (2013.01)

(56) References Cited

U.S. PATENT DOCUMENTS

| | | |
|---|---|---|
| 2006/0065964 A1 | 3/2006 | Ohsumi |
| 2007/0287265 A1 | 12/2007 | Hatano et al. |
| 2008/0230898 A1 | 9/2008 | Meguro et al. |
| 2009/0053856 A1 | 2/2009 | Ohsumi |
| 2009/0302429 A1 | 12/2009 | Ploessl et al. |
| 2010/0127340 A1 | 5/2010 | Sugizaki |

FOREIGN PATENT DOCUMENTS

| | | |
|---|---|---|
| JP | 5-13570 A | 1/1993 |
| JP | H09-260581 A | 10/1997 |
| JP | 2001-035972 A | 2/2001 |
| JP | 2002-34910 A | 2/2002 |
| JP | 2002-231920 A | 8/2002 |
| JP | 2003-31724 A | 1/2003 |
| JP | 2003-100943 A | 4/2003 |
| JP | 2003-335922 A | 11/2003 |
| JP | 2005-166692 A | 6/2005 |
| JP | 2005-206768 A | 8/2005 |
| JP | 2006-128625 A | 5/2006 |
| JP | 2008-130738 A | 6/2008 |
| JP | 2008-235401 A | 10/2008 |
| JP | 2009-537970 A | 10/2009 |
| JP | 2010-120145 A | 6/2010 |
| JP | 2010-212297 A | 9/2010 |
| JP | 2011-243596 A | 12/2011 |
| WO | WO 2005/022631 A1 | 3/2005 |
| WO | WO 2007/134581 A1 | 11/2007 |
| WO | WO 2009/088069 A1 | 7/2009 |
| WO | 2011/152003 A1 | 12/2011 |

OTHER PUBLICATIONS

International Search Report dated Jun. 4, 2013 issued in PCT/JP2013/060343.
Notice of Allowance and Issue Fee(s) Due dated Oct. 30, 2015 issued in U.S. Appl. No. 14/557,271.

\* cited by examiner

METHOD FOR PRODUCING IMAGE PICKUP APPARATUS AND METHOD FOR PRODUCING SEMICONDUCTOR APPARATUS

CROSS REFERENCE TO RELATED APPLICATION

This application is a continuation application of U.S. patent application Ser. No. 14/557,271 filed on Dec. 1, 2014, which is a continuation application of PCT/JP2013/060343 filed on Apr. 4, 2013 and claims benefit of Japanese Application No. 2012-123223 filed in Japan on May 30, 2012, the entire contents of each of which are incorporated herein by reference.

BACKGROUND OF THE INVENTION

1. Field of the Invention

The present invention relates to a method for producing an image pickup apparatus and a method for producing a semiconductor apparatus, the methods including a process of cutting a joined wafer where a plurality of image pickup chips (semiconductor chips) are bonded to a support substrate.

2. Description of the Related Art

A chip size package (CSP) method has been used for downsizing semiconductor apparatuses. In the CSP method, in a semiconductor chip where a semiconductor circuit section is formed on a first main face, a through-hole interconnection is formed up to a second main face, and an external connection terminal on the second main face is connected to an interconnection board.

Here, in a small image pickup apparatus, a transparent support member that protects a light receiving section that is the semiconductor circuit section is joined to a first main face of an image pickup chip on which the light receiving section is formed. A wafer level chip size package (WL-CSP) method has been used for collectively fabricating a plurality of image pickup apparatuses. In the WL-CSP method, an image pickup chip substrate on which a plurality of light receiving sections are formed, and a transparent support substrate are subjected to machining such as formation of through-hole interconnections in a joined wafer state in which the image pickup chip substrate and the transparent support substrate are bonded via an adhesive layer. After that, the joined wafer is individualized into individual image pickup apparatuses.

Note that Japanese Patent Application Laid-Open Publication No. 2011-243596 discloses a method for producing a package component by a CSP method in which semiconductor chips mounted on a mounting face of a silicon wafer are sealed by a sealing resin, and the silicon wafer is then polished or the like from an opposite face to the mounting face, and further individualized into individual package components.

That is, in the above production method, the semiconductor chips are not machined, but the silicon wafer is machined to become an interposer for the semiconductor chips.

SUMMARY OF THE INVENTION

A method for producing an image pickup apparatus of an embodiment of the present invention includes: a process of cutting an image pickup chip substrate where a plurality of light receiving sections are formed on a first main face and electrode pads are formed around each of the light receiving sections to fabricate a plurality of image pickup chips; a process of bonding the first main face of each of the image pickup chips determined as non-defective products to a transparent support substrate different from the image pickup chip substrate in at least either size or shape via a transparent adhesive layer to fabricate a joined wafer; a process of filling a sealing member among the plurality of image pickup chips bonded to the joined wafer; a machining process including a process of machining the joined wafer to thin a thickness of the joined wafer, from a second main face side to flatten a machining surface and a process of forming through-hole interconnections, each of which is connected to each of the electrode pads; a process of forming a plurality of external connection electrodes, each of which is connected to each of the electrode pads via each of the through-hole interconnections, on the second main face; and a process of cutting and individualizing the joined wafer.

DETAILED DESCRIPTION OF THE PREFERRED EMBODIMENT

<Embodiment>

Figure 1:
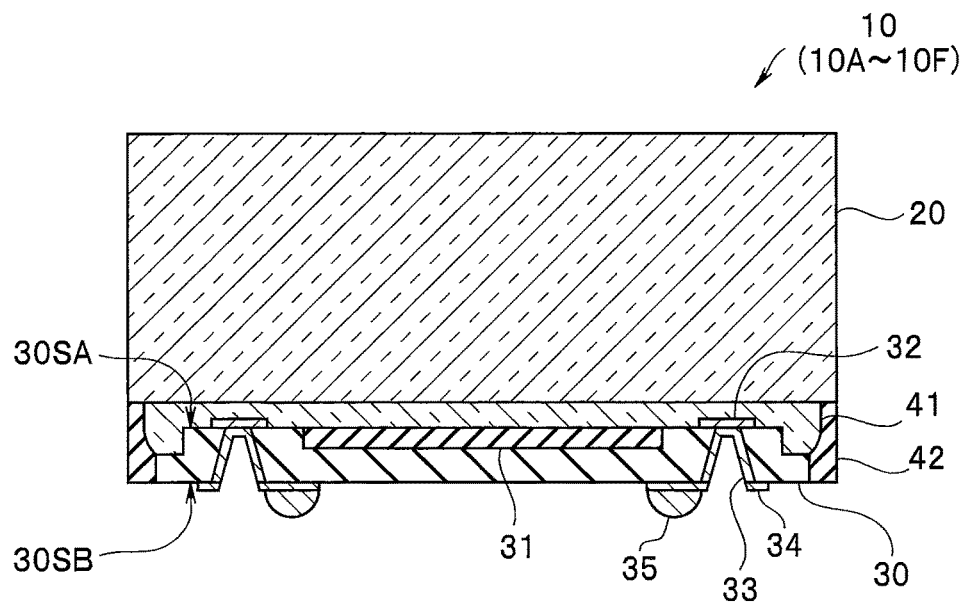
FIG. 1 is a sectional view of an image pickup apparatus of an embodiment.

As shown in FIG. 1, in an image pickup apparatus 10 that is a semiconductor apparatus, an image pickup chip (imager chip) 30, and a cover glass 20 that is a support substrate section (transparent flat plate section) are bonded via an adhesive layer 41 made of a transparent resin. A light receiving section 31 that is a semiconductor circuit section is formed on a first main face 30SA of the image pickup chip 30, and a plurality of electrode pads 32 connected to the light receiving section 31 by an interconnection (not shown) are further formed around the light receiving section 31 of the first main face 30SA. The electrode pad 32 is connected to an external connection electrode 34 and an external connection terminal 35 on a second main face 30SB via a through-hole interconnection 33. That is, the plurality of electrode pads 32 supply electricity to the light receiving section 31, and transmit and receive input and output signals to and from the light receiving section 31. Moreover, outer peripheral portions of the image pickup chip 30 and outer peripheral portions of the adhesive layer 41 are covered with a sealing member 42 with no gap therebetween.

Figure 2:
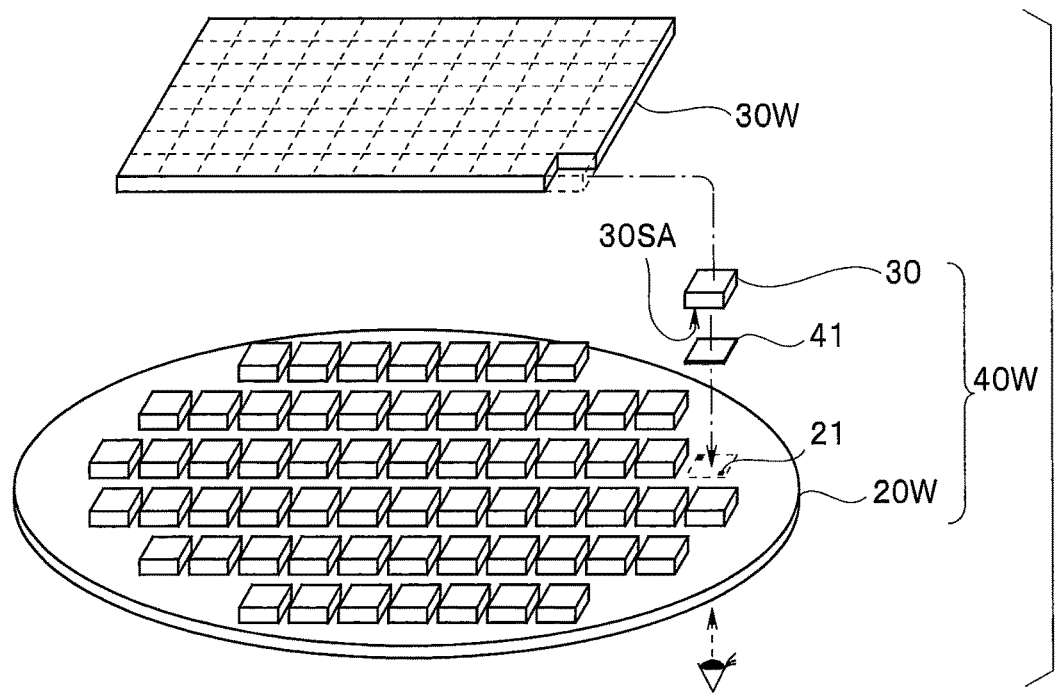
FIG. 2 is a perspective view for explaining a method for producing the image pickup apparatus of the embodiment.

That is, in the image pickup apparatus 10, a plan-view dimension of the cover glass 20 is larger than a plan-view dimension of the image pickup chip 30. This is because the image pickup apparatus 10 is fabricated by cutting (individualizing) a joined wafer 40W where a plurality of image pickup chips 30 are bonded to a glass wafer 20W, which is a transparent support substrate that becomes the cover glass 20, away from each other by a predetermined length via the adhesive layer 41 as shown in FIG. 2. As described below, on the glass wafer 20W, an alignment mark 21 for arranging each of the image pickup chips 30 at a predetermined position is formed. That is, since the glass wafer 20W is transparent, the alignment mark (first alignment mark) 21 and an alignment mark (second alignment mark) 36 (see FIG. 5) on the image pickup chip 30 can be aligned with each other from an opposite face to a face where the alignment mark 21 is formed.

Figure 3:
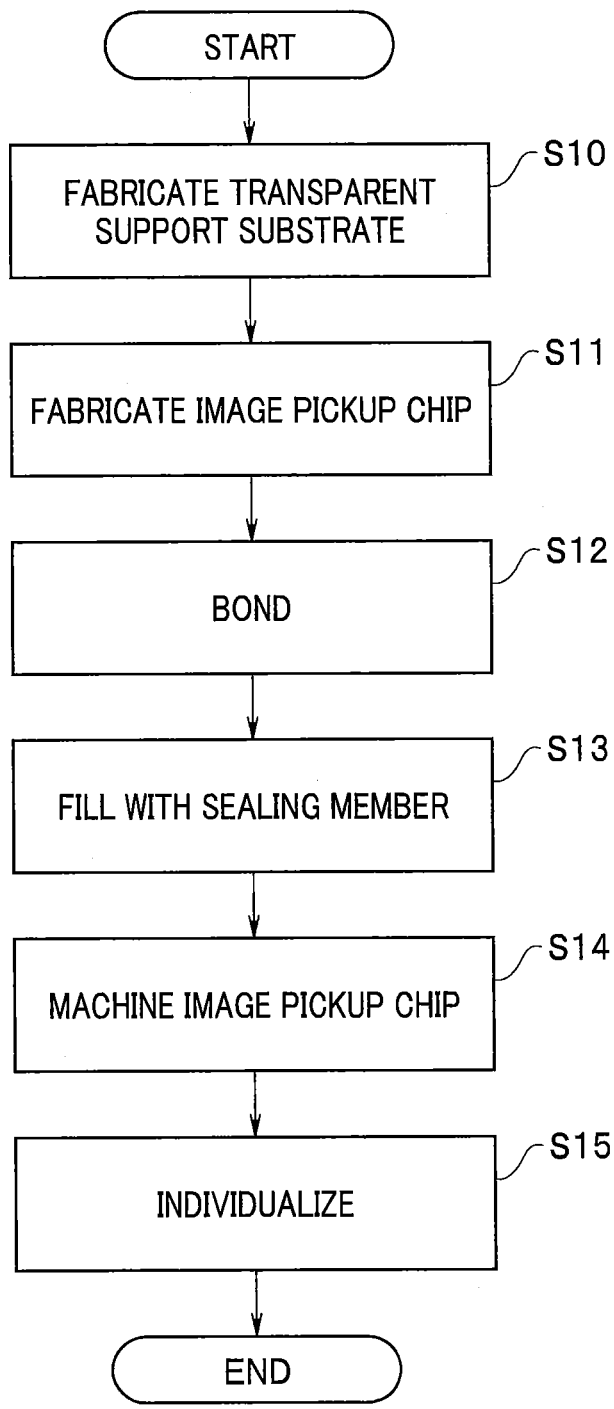
FIG. 3 is a flowchart for explaining the method for producing the image pickup apparatus of the embodiment.

Next, a method for producing the image pickup apparatus 10 of the embodiment is described in detail based on a flowchart in FIG. 3.

<Step 10> Glass Wafer Fabricating Process

Figure 4:
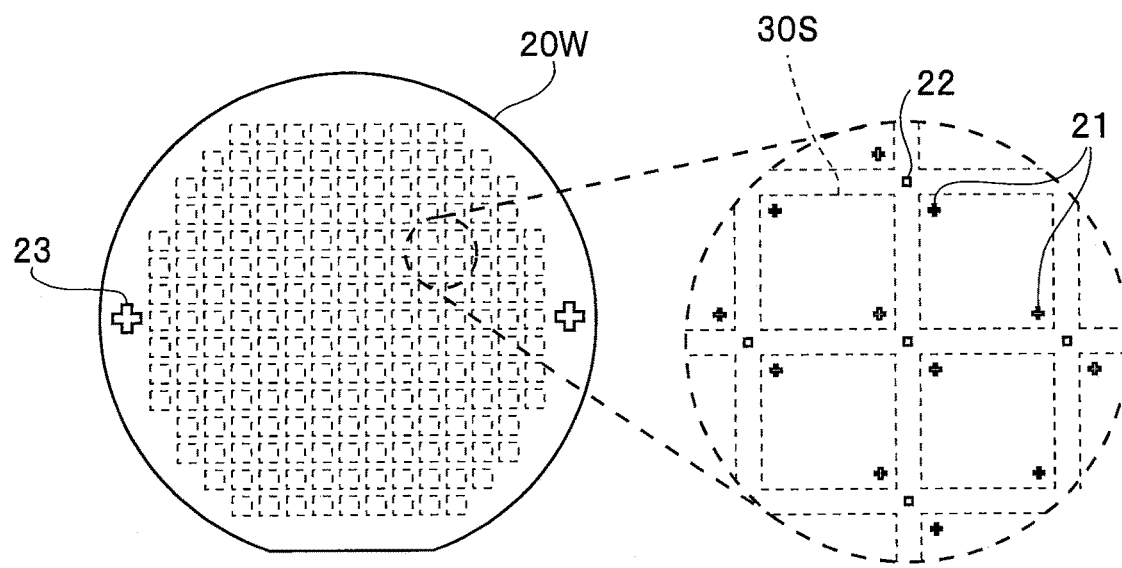
FIG. 4 is a plan view and a partially enlarged view of a transparent substrate of the image pickup apparatus of the embodiment.

As shown in FIG. 4, the alignment marks 21 for arranging the image pickup chips 30 at predetermined positions are formed on the glass wafer 20W that is the transparent support substrate. Note that an image pickup chip arrangement region 30S is indicated by a broken line for the sake of description in FIG. 4. The glass wafer 20W that is cut to become the cover glass 20 only needs to be transparent in a wavelength band of light for image pickup. For example, borosilicate glass, quartz glass, or single crystal sapphire is used.

Note that alignment marks 22 and alignment marks 23 are formed at the same time as formation of the alignment marks 21. The alignment marks 22 are used for dicing at a time of individualization, and the alignment marks 23 are used for machining such as formation of the through-hole interconnection 33 in the image pickup chip 30. The alignment marks 21 and the like are formed by, for example, performing patterning by photolithography after forming a metal layer of Al or the like on an entire face. It is preferable that two alignment marks be provided for one time of positioning processing for the respective alignment marks so as to perform accurate positioning. Note that the alignment marks 21 and the like may be also formed by partially etching the glass wafer 20W.

Note that a back face of the glass wafer 20W (the opposite face to the face where the alignment marks 21 are formed), which is not machined in following processes, may be covered with a photoresist or the like to be protected.

<Step 11> Image Pickup Chip Fabricating Process

Figure 5:
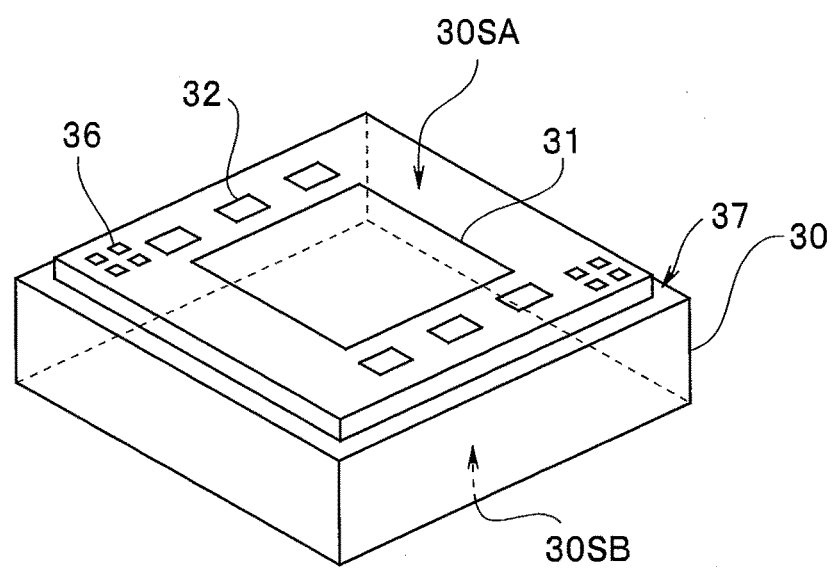
FIG. 5 is a perspective view of an image pickup chip of the image pickup apparatus of the embodiment.

The plurality of light receiving sections 31 that are the semiconductor circuit sections, the plurality of electrode pads 32 connected to each of the light receiving sections 31, and the plurality of alignment marks 36 are formed on the first main face 30SA of a semiconductor wafer such as a silicon wafer by a known semiconductor process, so that an image pickup chip substrate 30W (see FIG. 2) is fabricated. By cutting the image pickup chip substrate (semiconductor chip substrate) 30W, the plurality of image pickup chips (semiconductor chips) 30 shown in FIG. 5 are fabricated.

Sizes of the image pickup chip substrate and the glass wafer 20W are selected according to available production equipment or the like depending on a form and specifications etc. of the image pickup apparatus to be produced. Also, the image pickup chip substrate and the glass wafer 20W may be set to be in different sizes. For example, even when the image pickup chips are formed from a substrate having a large diameter of 12-inch (300-mm) φ, or from a still larger substrate, the individualized image pickup chips 30 are re-arrayed (bonded) on the glass wafer 20W of 8-inch (200-mm) φ, and subjected to machining. Accordingly, it becomes possible to produce the image pickup apparatus by equipment for 8-inch (200-mm) φ without using equipment or the like compatible with a large-diameter wafer. Moreover, a substrate and a wafer of different shapes, for example, the image pickup chip substrate of 8-inch (200-mm) φ and the glass wafer 20W of 6-inch (150-mm) squares, may be also used depending on equipment and apparatuses, etc. As described above, since the image pickup chip substrate and the glass wafer 20W of suitable sizes or shapes for available production equipment or the like (a production apparatus, a jig and a tool, etc.) can be used, the image pickup apparatus can be produced by effectively utilizing existing equipment or the like.

In following processes, only the image pickup chips 30 determined as non-defective products in an inspection process are used. That is, "defective chips" other than the non-defective products are not used in the following processes. Thus, even when a yield rate of the image pickup chips 30 of the image pickup chip substrate 30W is low, a decrease in yield rate of the image pickup chips obtained by re-arraying and re-machining the image pickup chips is not caused. Note that it is preferable to perform an inspection for determining defectiveness of the image pickup chips on the image pickup chips 30 in a state of the image pickup chip substrate 30W in view of work efficiency although the inspection may be performed on each of the individual image pickup chips 30 in an individualized state.

The alignment marks 36 correspond to the alignment marks 21 on the glass wafer 20W. As shown in FIG. 5, the alignment marks 36 are preferably formed respectively on outer peripheral portions facing each other with a center of the image pickup chip 30 therebetween. By previously forming the alignment marks on the glass wafer 20W and the image pickup chip 30, the image pickup chip 30 can be automatically placed with high precision by using a mounting apparatus.

Also, a step portion 37 is formed in the outer peripheral portions of the first main face 30SA of the image pickup chip 30. The step portion 37 is fabricated by dicing the image pickup chip substrate 30W by step cutting. The image pickup chip 30 with the step portion 37 can reduce a length L with an adjacent chip so as to prevent spread (a fillet) of an adhesive 41L to an outer side of the image pickup chip 30 when bonded to the glass wafer 20W. A micro lens group may be also disposed on the light receiving section 31.

<Step S12> Bonding Process

Figure 6A:
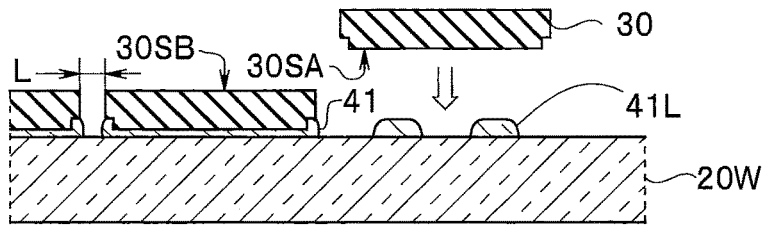
FIG. 6A is a sectional view for explaining the method for producing the image pickup apparatus of the embodiment.

As shown in FIG. 6A, the plurality of image pickup chips 30 are bonded to the glass wafer 20W away from each other by the predetermined length L to fabricate the joined wafer 40W. That is, the plurality of image pickup chips 30 formed on the image pickup chip substrate 30W on predetermined array conditions are then re-arrayed on the glass wafer 20W after cutting.

The length L needs to be longer than a thickness of a dicing blade used in a dicing process described below. However, if the length L is too long, the number of image pickup apparatuses that can be fabricated from the single glass wafer 20W is decreased. At a same time, the sealing member has a larger volume in a sealing member filling process described below, and a curing shrinkage stress becomes larger, so that a crack is easily generated. Therefore, the length L is preferably 15 μm or more and 500 μm or less, which is slightly longer than the thickness of the dicing blade.

Also, by setting the length L to a constant value among all of the image pickup chips 30, workability can be improved, and uniform filling of the sealing member is enabled in the sealing member filling process described below. The crack caused by unevenness of the curing shrinkage stress can be thereby prevented.

For example, the adhesive 41L in a liquid form is first applied in an appropriate amount to five positions of the image pickup chip arrangement region 30S of the glass wafer 20W. The image pickup chip arrangement region 30S can be grasped by the two alignment marks 21 arranged on a diagonal line. For example, a dispensing method of pushing out a solution from a distal-end nozzle of a dispenser and applying the solution is used as an application method.

As the adhesive 41L, a BCB (benzocyclobutene) resin, an epoxy-based resin, or a silicone-based resin etc., which satisfies such properties that the adhesive has high transparency (for example, a transmittance at visible wavelengths is 90% or more), has high adhesive strength, and is not deteriorated by heat or the like in subsequent processes, is used.

The image pickup chip 30 is then bonded to the glass wafer 20W in a state in which the first alignment marks 21 on the glass wafer 20W and the second alignment marks 36 on the first main face 30SA of the image pickup chip 30 are aligned with each other by using, for example, a flip chip bonder. The first alignment marks 21 and the second alignment marks 36 are set so as to be easily aligned with each other. For example, the first alignment mark 21 has a cross shape as shown in FIG. 4, and the second alignment mark 36 is composed of four squares as shown in FIG. 5.

Note that a reference mark may be previously formed on the glass wafer 20W without forming the alignment marks exclusive for the respective image pickup chips, and the image pickup chips 30 may be arranged at a predetermined pitch based on the reference mark. A throughput can be raised by using the above method. Also, alignment may be performed by using a pattern of the electrode pads 32 or the like formed on the image pickup chip 30 instead of the second alignment marks 36.

The liquid adhesive 41L is cured in a state in which the alignment marks are aligned with each other, and becomes the adhesive layer 41. By completely curing the liquid adhesive 41L while pressing the second main face of the image pickup chip at a predetermined pressure by a wafer-shaped pressing jig, parallelism between the main face of the image pickup chip and the main face of the glass wafer 20W is increased.

As a method for curing the adhesive 41L, any of a thermal curing method, a UV curing method, the UV curing method+the thermal curing method, the UV curing method+a moisture curing method, and a room temperature curing method etc. may be employed depending on the resin as long as desired properties are satisfied. By using a flip chip bonder including means for curing the adhesive 41L, such as a heating section or an UV irradiation section, the arrangement of the image pickup chip 30 at a predetermined position, and the curing of the adhesive 41L can be performed at a same time.

Note that attention needs to be paid when the adhesive 41L where voids are easily generated by rapid curing is used although the adhesive 41L may be completely cured by the flip chip bonder. In this case, it is preferable that, for example, when the adhesive 41L is cured by the flip chip bonder, the adhesive 41L is semi-cured to an extent where the image pickup chip 30 disposed at a predetermined position does not move to cause displacement, and after the plurality of image pickup chips 30 are disposed on the glass wafer 20W, the adhesive 41L is completely cured at a time and formed into the adhesive layer 41.

<Step S13> Sealing Member Filling Process

Figure 6B:
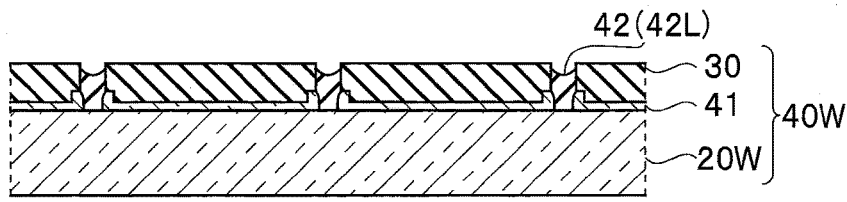
FIG. 6B is a sectional view for explaining the method for producing the image pickup apparatus of the embodiment.

As shown in FIG. 6B, a sealing resin 42L in a liquid form that is filled into a gap between the plurality of image pickup chips 30 disposed on the glass wafer 20W by, for example, a dispensing method is cured to become the sealing member 42. The sealing resin 42L may be also poured into the gap instead of the dispensing method.

By setting the arrangement length L between the plurality of image pickup chips 30 to 15 μm or more and 500 μm or less, the sealing member can be filled into the gap between the plurality of image pickup chips 30 by a capillary tube phenomenon. Note that a region where vertexes of the plurality of image pickup chips 30 face each other tends to have a small height (thickness) when filled with the sealing resin 42L. Therefore, after the sealing resin is cured once, the sealing resin may be applied again only to the portion where the vertexes of the plurality of image pickup chips 30 face each other.

The sealing member 42 preferably has a low moisture vapor transmission rate so as to improve humidity resistance of the image pickup apparatus 10, and is difficult to deteriorate by heat or plasma in subsequent processes. For example, a BCB resin or polyimide is used. Note that the sealing member 42 may be made of the same material as or a different material from the adhesive layer 41.

Also, the sealing member 42 preferably has a function as a light shielding member that prevents entrance of external light into the light receiving section. To this end, even when the sealing member 42 is made of the same resin as the adhesive layer 41, the resin is preferably used by mixing a light shielding material such as a dye or a black pigment therein. Note that a non-conductive material is used when the pigment or the like is used since the sealing member 42 needs to be an insulator.

A thickness of the sealing member 42, namely, a height of the filling only needs to be larger than a thickness of the image pickup chip 30 after thinning in step S14. That is, it is not necessary to completely fill the space between the plurality of image pickup chips 30 with the sealing member 42 before the thinning machining Conversely, the sealing member 42 may protrude from the space between the image pickup chips 30.

Note that it is preferable not to perform rapid heating or rapid cooling in the curing of the sealing resin 42L in order to prevent the crack occurrence due to the shrinkage stress when the sealing resin 42L is cured. Also, it is preferable that the sealing resin 42L be defoamed in vacuum before curing, or is cured in vacuum in order to prevent the occurrence of voids.

Note that the sealing member 42 is not limited to the cured liquid resin. For example, a sheet-like resin member may be cured after filling the space between the image pickup chips 30 wile embedding the image pickup chips 30 by vacuum hot pressing or vacuum laminating.

<Step S14> Image Pickup Chip Machining Process

Figure 6C:
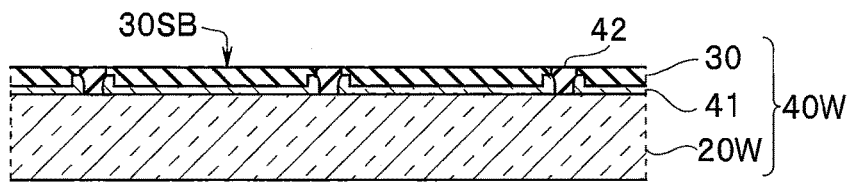
FIG. 6C is a sectional view for explaining the method for producing the image pickup apparatus of the embodiment.

As shown in FIG. 6C, the joined wafer 40W is thinned, so that the second main face 30SB side of the image pickup chip 30 is flattened. That is, a back grinding process and a CMP (chemical mechanical polishing) process are performed from the second main face 30SB side, and a machining surface is flattened.

In the back grinding process, a diamond wheel called a back grinding wheel is used. The CMP process is performed for reducing surface roughness of a surface grinded in the back grinding process.

Note that when a surface of the joined wafer 40W has large irregularities after being filled with the sealing member, preprocessing by another means is preferably performed before the back grinding process. For example, as the preprocessing, the sealing member 42 protruding from the gap between the image pickup chips 30 is shaved by a blade.

Note that dishing, which forms a recess in a center portion of the surface of the sealing member 42, may occur by the back grinding process and the CMP process. However, since the recessed portion is removed in the dicing process, there occurs no problem.

The second main face 30SB of the image pickup chip 30 and the surface of the sealing member 42 on the joined wafer 40W after thinning machining form a flat face. For the joined wafer 40W in which the machining surface has been flattened, a similar process to that of a normal semiconductor wafer can be performed unlike a wafer having an uneven surface.

Figure 6D:
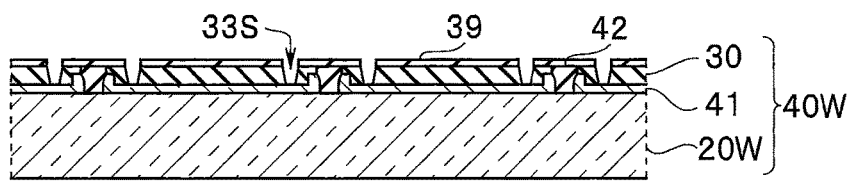
FIG. 6D is a sectional view for explaining the method for producing the image pickup apparatus of the embodiment.

That is, as shown in FIG. 6D, a through-hole via 33S for forming the through-hole interconnection 33 that is connected to the electrode pad 32 formed on the first main face 30SA of the image pickup chip 30 is formed by the normal semiconductor wafer process. To form the through-hole via, an etching mask 39 having an opening in a region immediately above each of the electrode pads 32 is formed on the image pickup chips 30 and the sealing member 42. The etching mask also serves as a protective layer for protecting the image pickup chips 30 and the sealing member 42 from chemicals and plasma used in a subsequent process. For example, the silicon oxide film or the silicon nitride film is used as the etching mask 39. Since the film formation can be performed at low temperature as the method for forming the etching mask 39, and no damage is caused on the semiconductor circuit section or the like formed on the image pickup chip 30, plasma CVD is preferably used.

Note that the alignment marks 23 for forming the through-hole interconnection, which are previously formed on the glass wafer 20W, are used for alignment of a photo mask used when a patterning mask (not shown) for forming the opening in the etching mask 39 is formed.

The through-hole via 33S reaching the electrode pad 32 is formed by wet etching using an alkali solution such as KOH or TMAH, or dry etching by an ICP-RIE method or the like. Note that the through-hole via 33S may be also formed by a physical machining method such as laser machining.

Figure 6E:
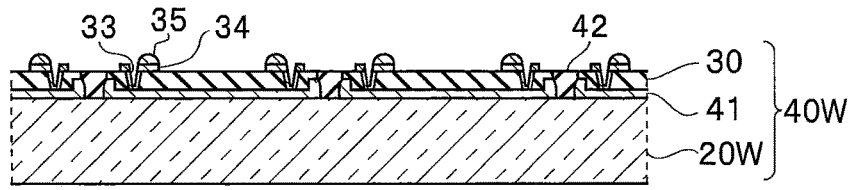
FIG. 6E is a sectional view for explaining the method for producing the image pickup apparatus of the embodiment.

As shown in FIG. 6E, the through-hole interconnection 33 composed of a conductor is formed in an inner portion of the through-hole via 33S after an insulating layer (not shown) is formed on a wall face etc. of the through-hole via 33S. Then, after the etching mask 39 is removed, the external connection electrode 34 connected to the through-hole interconnection 33 is formed on the second main face 30SB of the image pickup chip 30. Furthermore, the projecting external connection terminal 35 is disposed on the external connection electrode 34.

Note that a plating process may be used in the through-hole interconnection forming process, and a solder ball etc. may be used as the external connection terminal 35.

<Step S15> Individualizing Process (Dicing Process)

A plurality of image pickup apparatuses 10 are fabricated from the single joined wafer 40W by an individualizing process of cutting the joined wafer 40W.

Figure 6F:
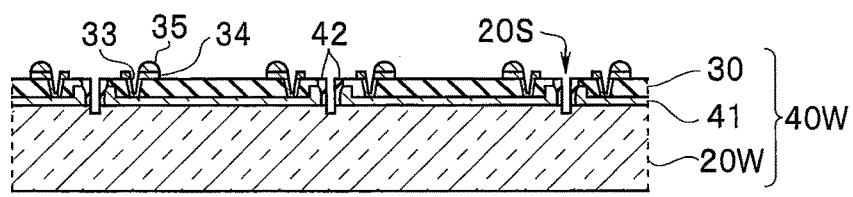
FIG. 6F is a sectional view for explaining the method for producing the image pickup apparatus of the embodiment.
Figure 6G:
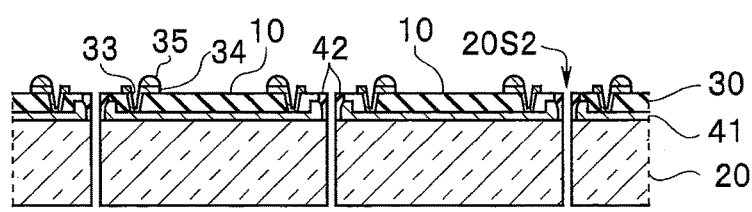
FIG. 6G is a sectional view for explaining the method for producing the image pickup apparatus of the embodiment.

For cutting, a two-stage dicing method shown in FIGS. 6F and 6G is preferable. That is, after the joined wafer 40W is half-cut to about 10 to 200 μm from a surface of the glass wafer 20W (an upper side in the drawings), the glass wafer 20W is subjected to full-cut dicing, so that a crack occurrence due to a stress and stripping of the sealing member 42 can be prevented. Moreover, in the two-stage dicing method, a blade type (a bond material, an abrasive grain diameter, a degree of concentration) and machining conditions (a feed speed, a rotation speed) suitable for resin are used for dicing the sealing member 42, and a blade type and machining conditions suitable for glass are used for dicing the glass wafer 20W. A machining quality (resin burrs, chipping of glass, and delamination of a resin layer) can be thereby improved. Also, step cutting by which a step is formed in end portions of the individualized image pickup chips 30 may be performed by setting the blade for resin to a larger thickness than the blade for glass.

Also, the glass wafer 20W may be subjected to full-cut dicing by blade dicing for glass or laser dicing, and thereby individualized after removing the sealing member 42 on a dicing line by laser dicing or etching.

In alignment of dicing, the alignment marks 22 firstly formed on the glass wafer 20W are used. Note that, instead of the alignment marks 22, an alignment mark for dicing may be formed on the second main face 30SB of the image pickup chip 30 or on the sealing resin between the image pickup chips 30 in the through-hole interconnection forming process or the like.

In the production method of the embodiment, even when the image pickup chip substrate 30W has a low yield rate of image pickup devices, the joined wafer 40W is fabricated by using only the non-defective image pickup chips 30. Therefore, the defective chip is not produced into the image pickup apparatus, so that the image pickup apparatus 10 can be produced at low cost, and productivity is high.

Also, in the production method of the embodiment, the image pickup apparatus can be produced by using the joined wafer 40W with a predetermined diameter regardless of the diameter of the image pickup chip substrate 30W. Since machining equipment compatible with a large diameter is unrequired, productivity is high.

Moreover, since the image pickup chip with a large thickness before being machined is bonded to the glass wafer 20W, the image pickup chip is easily handled. That is, the image pickup chip that is thinned for forming the through-hole interconnection is easily damaged, and easily deformed by a stress during bonding or the like. However, in the production method of the embodiment, the image pickup chip in a thick state can be bonded to the glass wafer 20W.

Also, since the support substrate is the transparent glass wafer 20W, alignment using the alignment marks can be performed from the opposite face to the image pickup chip bonded face as shown in FIG. 2.

Also, since the chip arrangement length is set to a constant value, it is easy to fill the sealing resin 42L, thereby preventing the crack in the sealing resin 42L. Thus, a production yield rate is high.

The image pickup chip 30 and the sealing member 42 can be treated as a single wafer by making the outer face of the image pickup chip 30 and the outer face of the sealing member 42 flush with each other by the CMP. Thus, the semiconductor wafer process can be performed on a chip-shaped component, and high-precision and high-density machining can be performed.

The image pickup apparatus 10 includes the image pickup chip 30 that is the semiconductor chip where the light receiving section 31 that is the semiconductor circuit section is formed on the first main face 30SA, the cover glass 20 that is the support substrate section having a larger plan-view dimension than the image pickup chip 30, the transparent adhesive layer 41 that bonds the first main face 30SA of the cover glass 20 and the image pickup chip 30, and the sealing member 42 that covers a side face of the image pickup chip 30 and a side face of the adhesive layer 41, and is made of an insulating material having a same outer dimension (plan-view dimension) as the cover glass 20.

That is, the side face of the image pickup chip 30 is covered with the sealing member 42, and the image pickup chip 30 is not exposed outside. Therefore, the image pickup apparatus 10 has excellent electrical insulating properties and humidity resistance.

Note that a functional member may be further added to the image pickup apparatus 10 of the above embodiment. For example, an objective lens unit may be joined to the opposite face to the face of the glass wafer 20W where the image pickup chip 30 is bonded in alignment with the image pickup chip 30. Also, a digital signal processor (DSP) chip for processing an image pickup signal may be joined to the second main face 30SB of the image pickup chip 30.

A backside irradiation-type image pickup apparatus may be also produced through processes of bonding an interconnection layer side of the image pickup chip 30 to the support substrate, filling the sealing resin into the gap between the image pickup chips 30, thinning the image pickup chip 30 to about 3 μm to expose the light receiving section 31, thereafter forming a color filter and a micro lens on the light receiving section 31, and removing a silicon layer on the electrode to expose the electrode.

Also, the semiconductor chip is not limited to the image pickup chip, and any type, such as general semiconductor chips, various sensors or actuators, may be employed. The semiconductor apparatus to be produced is also not limited to the image pickup apparatus.

<Modifications>

Next, methods for producing image pickup apparatuses 10A to 10F of Modifications 1 to 6 of the embodiment of the present invention are described. Since the methods for producing the image pickup apparatuses 10A to 10F are similar to the method for producing the image pickup apparatus 10 and have the same effects, the same constituent elements are assigned the same reference numerals, and description thereof is omitted.

<Modification 1>

Figure 7:
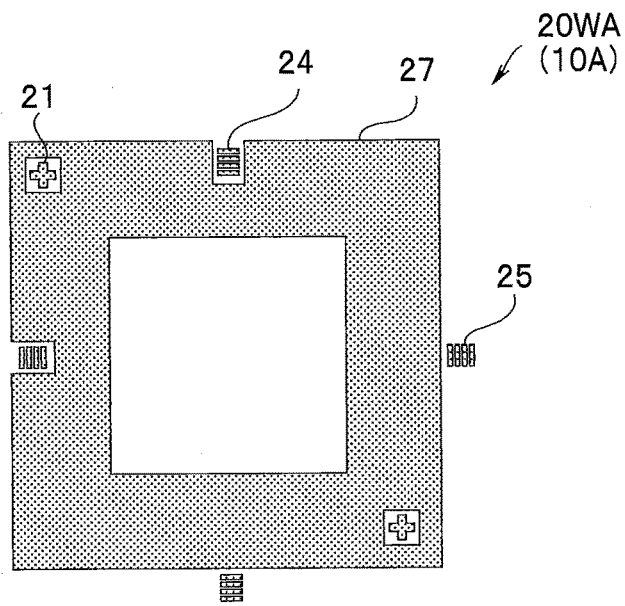
FIG. 7 is a partially enlarged view of a transparent substrate of an image pickup apparatus of Modification 1.

The method for producing the image pickup apparatus 10A of Modification 1 is characterized in alignment marks and the like formed on the glass wafer 20W. As shown in FIG. 7, when the alignment marks 21 are formed, displacement evaluation marks 24, adhesive fillet evaluation marks 25 and a light shielding film 27 are formed at the same time.

An amount of displacement of the image pickup chips 30 can be measured from an opposite face of the glass wafer 20W by the displacement evaluation marks 24. If the amount of displacement is large, position adjustment can be performed to reduce the defectiveness. It is also possible to measure an amount of spread of the adhesive 41L protruding from a bonding face, that is, a portion referred to as a so-called fillet, by the adhesive fillet evaluation marks 25. In a case of excess or deficiency of the spread of the fillet, an amount of adhesive to be supplied can be adjusted to reduce the defectiveness. The light shielding film 27 prevents entrance of unnecessary light to the image pickup chips 30.

Note that the image pickup apparatus 10A only needs to have any of the marks 24, the marks 25 and the light shielding film 27 according to its specifications and the like.

<Modification 2>

Figure 8:
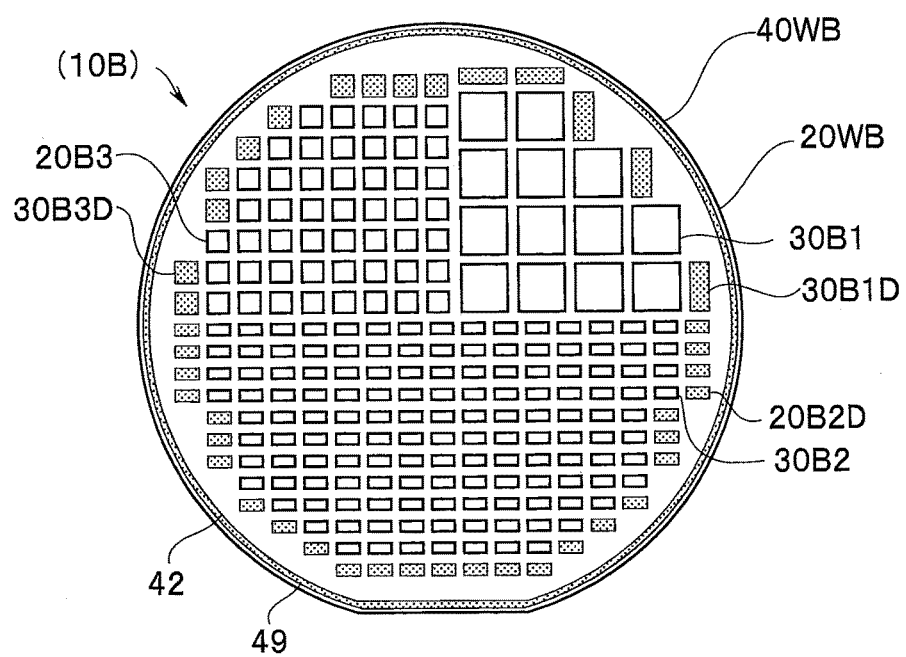
FIG. 8 is a plan view for explaining a method for producing an image pickup apparatus of Modification 2.

In the method for producing the image pickup apparatus 10B of Modification 2, as shown in FIG. 8, plural kinds of image pickup chips 30B1, 30B2 and 30B3 having different chip sizes (plan view dimensions and thicknesses) are bonded to the one glass wafer 20W, and plural kinds of image pickup apparatuses 10B are fabricated from one joined wafer 40WB. Otherwise, plural kinds of image pickup chips with a same size and different pixel sizes etc. may be bonded to the single glass wafer 20W to fabricate plural kinds of image pickup apparatuses 10B. Since the production method of Modification 2 makes it possible to collectively produce diversified models of image pickup apparatuses 10B from the single joined wafer 40WB, the method is suitable for diversified small-quantity production.

Note that, in a case of bonding chips with different sizes to the single glass wafer 20W, the dicing process can be performed easily by collectively disposing image pickup chips with the same size in a predetermined region.

Note that, in the case of bonding chips with different sizes to the single glass wafer 20W also, it is preferable that the displacement length L between the image pickup chips be a constant value. This is for the purpose of improving workability in the filling process. Also, since the sealing resin 42L can be uniformly filled, it is possible to prevent crack occurrence on the sealing member 42 due to uneven stress.

Note that, by changing the kind of the adhesive 41L for each kind of the image pickup chip 30, it is possible to change a refractive index of the adhesive layer 41 according to a refractive index of microlens material or use either high-reliability adhesive or low-reliability but inexpensive adhesive etc. according to a required reliability level.

Furthermore, function chips other than image pickup chips may be bonded to the glass wafer 20W. As examples of the function chip, a process evaluation chip, a DSP chip having functions required for outputting an image from the image pickup chip 30 and the like can be given.

The process evaluation chip is given, for example, a function of evaluating an amount of etching for a through-hole via, an amount of etching for an oxide film, interconnection resistance, interconnection capacity, interconnection inductance or plasma damage.

By connecting the DSP chip and the image pickup chip 30, which are bonded to the glass wafer 20W adjoining each other, via interconnection, image output evaluation of the image pickup chip 30 can be performed in a wafer state.

Note that dummy chips 30B 1D, 30B2D and 30B3D are arranged on the outer peripheral portion of the joined wafer 40WB. Since the volume of the sealing resin 42L on the outer peripheral portion of the wafer is reduced by arranging the dummy chip 30B1D etc., crack occurrence can be prevented.

Furthermore, successive projecting portions (dam) 49 made of resin are formed on a most outer periphery of the joined wafer 40WB, for example, by the dispensing method. Therefore, it does not happen that liquid resin, which is to be a sealing member, protrudes outside the cover glass 20WB or flows to a back face.

A position where an opening of the etching mask of the through-hole via 33S is to be formed is immediately under the electrode pads 32 of the image pickup chip 30. When different kinds of image pickup chips 30 are arranged on the glass wafer, the size, position and pitch of the through-hole via 33S are designed according to the size, position and pitch of the electrode pad 32 of each image pickup chip 30.

When the image pickup chips 30 having different depths from back faces thereof to back faces of the electrode pads mixedly exist, it is desirable that the opening of the protective layer (the etching mask 39) provided for such image pickup chips 30 that the depth to the back face of the pad is short is designed small so that the through-hole via 33S with a desired size can be obtained according to horizontal-direction spread at a time of etching.

When different kinds of image pickup chips 30 are arranged in the wafer, a different inspection is performed for each image pickup chip 30 with the use of a probe card corresponding to the image pickup chip 30.

<Modification 3>

Figure 9A:
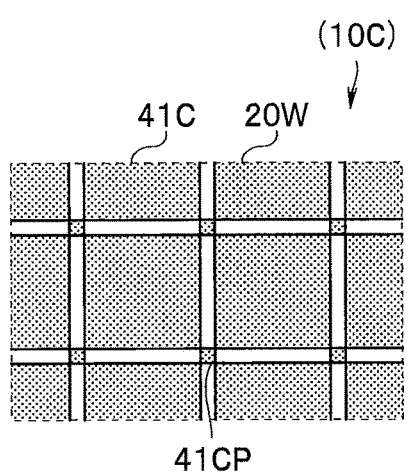
FIG. 9A is a plan view for explaining a method for producing an image pickup apparatus of Modification 3.
Figure 9B:
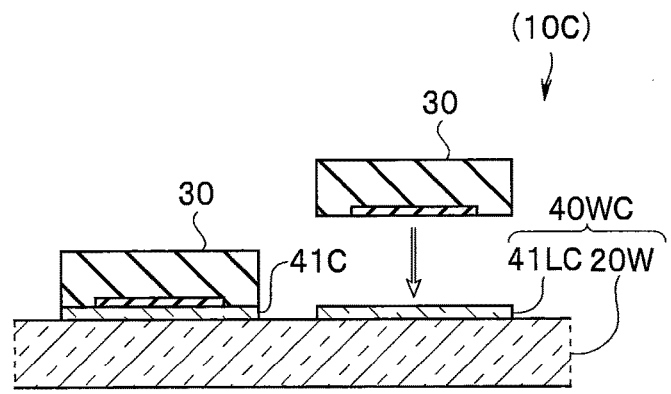
FIG. 9B is a sectional view for explaining the method for producing the image pickup apparatus of Modification 3.

As shown in FIGS. 9A and 9B, in the method for producing the image pickup apparatus 10C of Modification 3, an adhesive 41LC disposed on a glass wafer 20WC is patterned to be in substantially the same shape as the image pickup chip arrangement region 30S. For example, the adhesive 41LC is patterned by photolithography after application of a photosensitive resin. As for the application, a liquid adhesive may be spin-coated, or a film-type adhesive may be laminated. Then, the image pickup chips 30 are bonded to the glass wafer 20WC via the patterned adhesive 41LC by thermocompression bonding, and the joined wafer 40WC bonded via an adhesive layer 41C is fabricated.

The production method of Modification 3 makes it possible to perform production in a shorter time period than a production method in which an adhesive is arranged at each of a lot of positions corresponding to the respective image pickup chips 30 before placing the image pickup chips at the positions. Since the adhesive 41LC does not exist among the image pickup chips 30, heat is not easily transmitted in a horizontal direction accordingly, and it does not happen that, at a time of thermal curing of the image pickup chip 30, the uncured adhesive 41LC of adjoining image pickup chips are cured.

Note that a region where vertexes of the image pickup chips 30 face each other tends to have a small height (thickness) when filled with the sealing resin 42L. Therefore, it is preferable that post patterns 41CP by the patterned adhesive 41LC be disposed as shown in FIG. 9A.

A dam for preventing the sealing resin from flowing out may be formed on the outer peripheral portion of the wafer by patterning the adhesive 40LC. Alignment marks for positioning with the image pickup chips may be formed by patterning the adhesive 40LC.

<Modification 4>

Figure 10A:
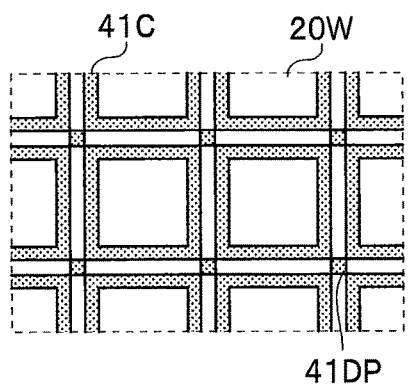
FIG. 10A is a plan view for explaining a method for producing an image pickup apparatus of Modification 4.
Figure 10B:
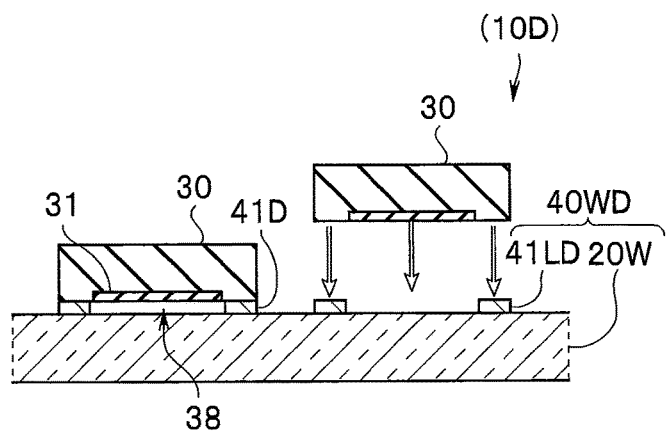
FIG. 10B is a sectional view for explaining the method for producing the image pickup apparatus of Modification 4.

As shown in FIGS. 10A and 10B, in the method for producing the image pickup apparatus 10D of Modification 4, an adhesive 41LD disposed on a glass wafer 20WD is patterned to be in a frame shape. That is, the adhesive 41LD is in a frame shape with a width between 25 μm and 50 μm along the outer peripheral portion of the light receiving section. Therefore, in the image pickup apparatus 10D, the light receiving section 31 on which a microlens (not shown) is disposed is in contact with a cavity (cavity portion) 38.

Since an outer peripheral interface of the microlens on the light receiving section 31 is in contact with the cavity 38 with a refractive index smaller than that of an adhesive layer 41D, a light collection effect of the microlens is high. Therefore, the sensitivity of the image pickup apparatus 10D is higher than that of the image pickup apparatus 10C. Such a cavity structure can be also realized by forming recessed portions at positions corresponding to the light receiving sections of the image pickup chips 30 on the glass wafer 20W.

Note that diversified production is realized by causing the image pickup apparatus 10D having the cavity 38 and the image pickup apparatus 10C not having the cavity 38 to mixedly exist on one joined wafer 40WD.

<Modification 5>

Figure 11A:
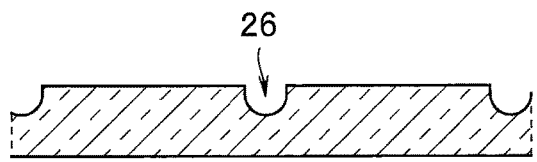
FIG. 11A is a sectional view for explaining a method for producing an image pickup apparatus of Modification 5.

As shown in FIG. 11A, in the method for producing the image pickup apparatus 10E of Modification 5, when the image pickup apparatus 10C is produced, a frame-like groove 26 is formed by, for example, a dicing blade in outer peripheral portions around the respective image pickup chip arrangement regions 30S of a glass wafer 20WE before the bonding process. The groove 26 may be formed by etching. At the same time, the first alignment marks 21 and the like may be formed.

Figure 11B:
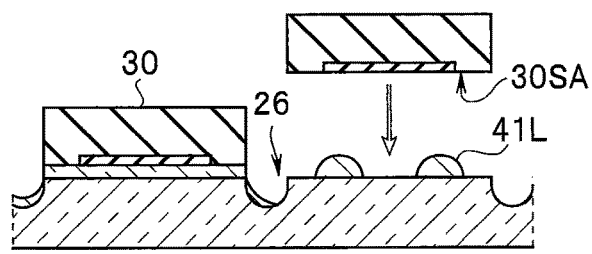
FIG. 11B is a sectional view for explaining the method for producing the image pickup apparatus of Modification 5.
Figure 11C:
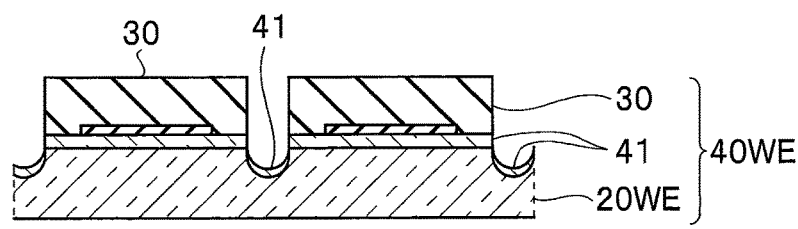
FIG. 11C is a sectional view for explaining the method for producing the image pickup apparatus of Modification 5.

As shown in FIGS. 11B and 11C, the image pickup chips 30 are heated and pressurized in an aligned state and bonded to the glass wafer 20WE by using, for example, a flip chip bonder. In the image pickup apparatus 10E, an excess amount of the adhesive 41L flows into the groove 26. Therefore, a fillet is not spread horizontally (a main face parallel direction) or vertically (a main face perpendicular direction). Since the fillet is not spread horizontally, a lot of image pickup apparatuses 10E can be fabricated from a single joined wafer 40WE by reducing the arrangement length L between the image pickup chips 30.

Figure 11D:
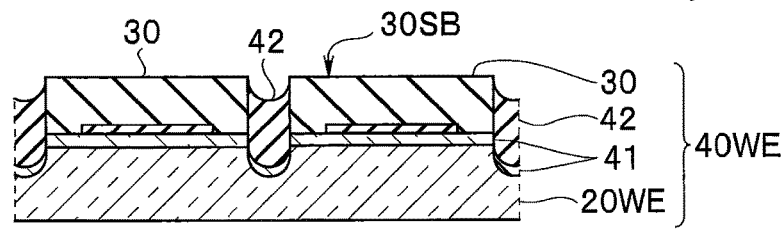
FIG. 11D is a sectional view for explaining the method for producing the image pickup apparatus of Modification 5.
Figure 11E:
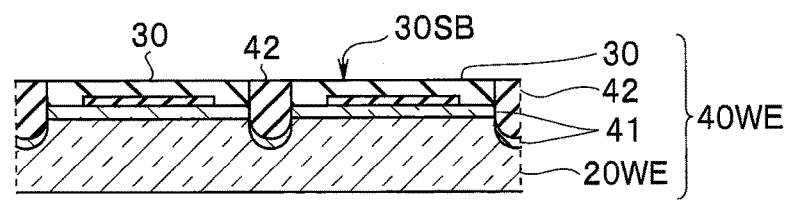
FIG. 11E is a sectional view for explaining the method for producing the image pickup apparatus of Modification 5.
Figure 11F:
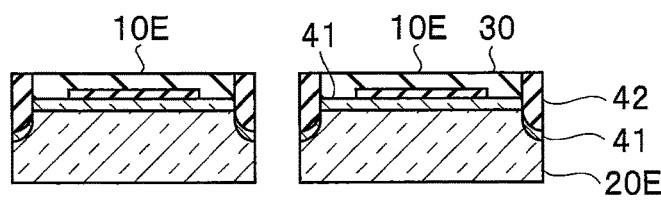
FIG. 11F is a sectional view for explaining the method for producing the image pickup apparatus of Modification 5.

Also, as shown in FIGS. 11D to 11F, since the fillet of the adhesive 41L does not spread vertically, the sealing member 42 is surely filled up to the outer peripheral portions of the image pickup chip 30 in the sealing member filling process in the image pickup apparatus 10E. Since a resin having a higher sealing effect than that of the adhesive layer 41 can be used for the sealing member 42, reliability of the image pickup apparatus 10E is higher than that of the image pickup apparatus 10 which has a possibility that the adhesive layer 41 is exposed on an outer face due to a fillet creeping up.

Note that it is preferable to form the frame-like groove 26 so that inner-side plan view dimensions thereof are smaller than plan view dimensions of the image pickup chip 30. This is because the sealing member 42 covers the outer peripheral portions of the first main faces 30SA of the image pickup chips 30 when the sealing member 42 is filled, and adhesion and sealing effects are improved by an anchor effect.

It is also preferable to curve a bottom surface of a bottom portion of the groove 26 using a shape of the dicing blade as shown in FIG. 11A. This is because, if the bottom portion of the groove 26 is rectangular, voids occur between the adhesive 41L flown in and corners of the groove 26, and reliability may be reduced.

It is also preferable that a thermal expansion coefficient of the sealing member 42 existing on an upper side inside the groove 26 be smaller than a thermal expansion coefficient of the adhesive layer 41 existing on a lower side. This corresponds to a fact that a thermal expansion coefficient of the image pickup chips 30 made of silicon and forming an upper-side wall face of the groove 26 is smaller than that of the cover glass 20 made of glass and forming a lower-side wall face of the groove 26. That is, by causing a magnitude relationship between thermal expansion coefficients of glass and silicon to be the same as a magnitude relationship between the thermal expansion coefficients of the adhesive layer 41 and the sealing member 42, it becomes difficult for the adhesive layer 41 and the sealing member 42 to come off from the groove 26 even if transformation due to thermal expansion occurs.

Note that, if the groove 26 of the glass wafer 20WE is formed by a dicing blade, linear cutting scars are left on the wall face of the groove 26. The cutting scars have an effect of diffusing light and reducing reflection. Therefore, even if a side face of the cover glass 20 is close to the light receiving sections 31, a flare does not easily occur.

<Modification 6>

Figure 12A:
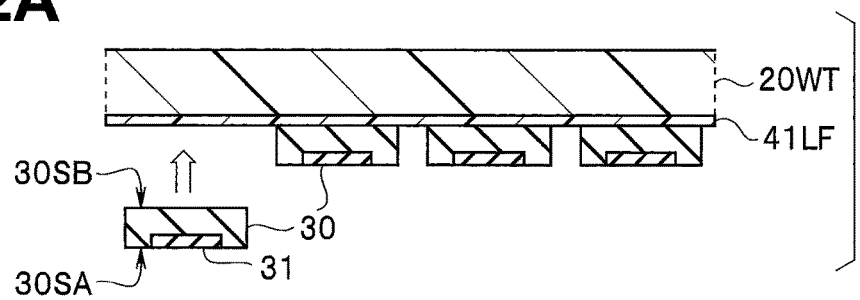
FIG. 12A is a sectional view for explaining a method for producing an image pickup apparatus of Modification 6.

As shown in FIG. 12A, in the method for producing the image pickup apparatus 10F of Modification 6, the second main faces 30SB of the plurality of image pickup chips 30 are bonded to a temporary support substrate 20WT, which is a second support substrate, via an adhesive 41LF for temporary bonding. The temporary support substrate 20WT may be made of the same glass as that of the glass wafer 20W but does not need to be transparent. The adhesive 41LF is a temporary adhesive in which the adhesive strength is weakened by heat, ultraviolet rays, warm water, a solvent or the like.

Alignment marks for positioning with the image pickup chips 30 and alignment marks for positioning with the glass wafer 20W are formed on the temporary support substrate 20WT. Note that it is also possible to form marks for positioning on a back face of the temporary support substrate 20WT and perform positioning with the image pickup chips 30 using the marks.

In a case of performing positioning of the image pickup chips 30 by recognizing the alignment marks formed on the temporary support substrate 20WT through the adhesive layer 41LF, it is preferable that the adhesive layer 41F be highly transparent. As for illumination, it is easy to recognize an image by using ring illumination makes.

Figure 12B:
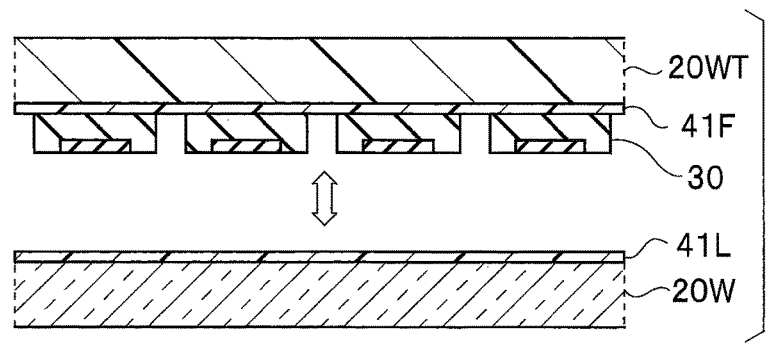
FIG. 12B is a sectional view for explaining the method for producing the image pickup apparatus of Modification 6.

As shown in FIG. 12B, the first main faces 30SA of the plurality of image pickup chips 30 bonded to the temporary support substrate 20WT are collectively bonded to the glass wafer 20W via the adhesive 41L. That is, positioning and bonding of the temporary support substrate 20WT and the glass wafer 20W is performed with the use of a wafer aligner and a wafer bonder.

In a case where it takes much time for the adhesive 41L to cure, if the image pickup chips 30 are bonded one by one, it requires a long time period to bond all the image pickup chips 30. In the method for producing the image pickup apparatus 10F of Modification 6, however, it is possible to shorten the time period, and productivity is high.

Furthermore, when the image pickup chips 30 are thermal-cured and bonded on the adhesive 41L applied on a whole surface of the glass wafer 20W one by one, it may happen that even the adhesive 41L of adjoining image pickup chip arrangement regions 30S also cure, and adjoining chips cannot be bonded. In the method for producing the image pickup apparatus 10F of Modification 6, however, such a problem does not occur.

Furthermore, since the plurality of image pickup chips 30 are simultaneously pressed onto the glass wafer 20W by the temporary support substrate 20WT, inclination of main faces of the bonded image pickup chips 30 relative to a main face of the glass wafer 20W can be uniform.

Figure 12C:
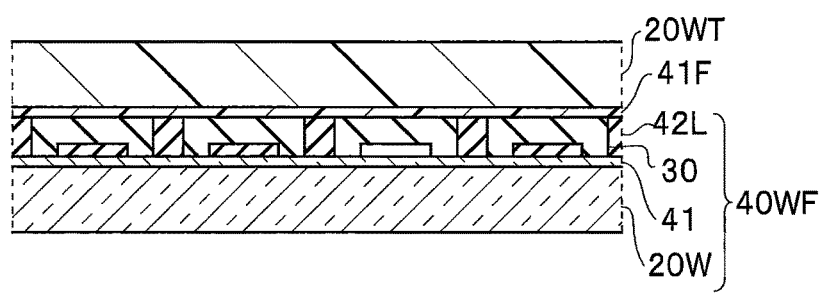
FIG. 12C is a sectional view for explaining the method for producing the image pickup apparatus of Modification 6.

As shown in FIG. 12C, spaces among the image pickup chips 30 are sealed with the sealing member 42. That is, a space between the temporary support substrate 20WT and the glass wafer 20W is filled with the sealing resin 42L.

The filling of the sealing resin 42L may be performed after separating the temporary support substrate 20WT. By performing the filling before separating the temporary support substrate 20WT, however, it does not happen that the sealing member 42 protrudes on the second main faces 30SB of the image pickup chips 30, and it is easy to perform a subsequent polishing process because the second main faces 30SB of the image pickup chips 30 and a surface of the sealing member 42 are flattened without unevenness.

As for filling the sealing resin 42L, openings on a side face of a joined wafer 40WF excluding one opening are covered. Then, by decompressing the space to be filled with the sealing member 42 and releasing pressure in a state that the openings on the side face are soaked in the sealing resin 42L stored in a container, the sealing resin 42L is absorbed.

Note that it is also possible to apply the adhesive 41L thick on the glass wafer 20W so that the spaces among the image pickup chips 30 are filled with the adhesive 41L applied thick when the image pickup chips 30 are bonded. That is, in this case, the adhesive 41L has a function of the sealing resin 42L also.

Figure 12D:
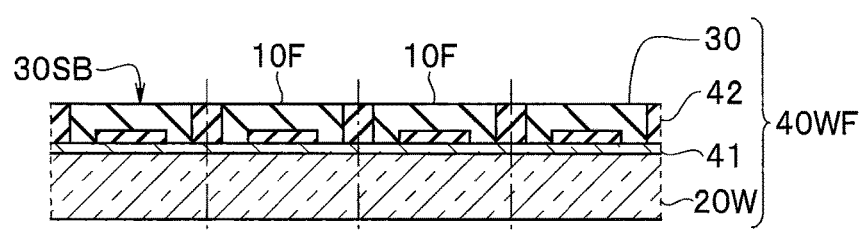
FIG. 12D is a sectional view for explaining the method for producing the image pickup apparatus of Modification 6.

As shown in FIG. 12D, by separating the temporary support substrate 20WT, the joined wafer 40W is fabricated. A subsequent process is similar to that of FIG. 6D etc. already described.

Since the methods for producing the image pickup apparatus of the above embodiment and modifications make it possible to produce an ultra-small and highly reliable image pickup apparatus, the methods can be used particularly as a method for producing an image pickup apparatus disposed at a distal end portion of an electronic endoscope or in a capsule endoscope.

The present invention is not limited to the aforementioned embodiments, and various changes, modifications etc. can be made therein without departing from the scope of the present invention.

What is claimed is:
1. A method for producing an image pickup apparatus, the method comprising:
a process of cutting an image pickup chip substrate where a plurality of light receiving sections are formed on a first main face and electrode pads are formed around each of the light receiving sections to fabricate a plurality of image pickup chips;

a process of bonding the first main face of each of the image pickup chips to a transparent glass wafer via a transparent adhesive layer to fabricate a joined wafer;

a process of mounting objective lenses on a face of the transparent glass wafer opposite to a face on which each of the image pickup chips is bonded; and a process of cutting and individualizing the joined wafer.

2. A method for producing an image pickup apparatus, the method comprising:

a process of cutting an image pickup chip substrate where a plurality of light receiving sections are formed on a first main face and electrode pads are formed around each of the light receiving sections to fabricate a plurality of image pickup chips;

a process of bonding the first main face of each of the image pickup chips to a transparent glass wafer via an adhesive layer to fabricate a joined wafer;

a process of joining a processing circuit chip for processing an image pickup signal outputted from each of the image pickup chips on a second main surface of each of the image pickup chips; and a process of cutting and individualizing the joined wafer.

3. A method for producing an image pickup apparatus, the method comprising:

a process of cutting an image pickup chip substrate where a plurality of light receiving sections are formed on a first main face and electrode pads are formed around each of the light receiving sections to fabricate a plurality of image pickup chips;

a process of bonding the first main face of each of the image pickup chips to a support substrate to fabricate a joined wafer;

a process of thinning the joined wafer from a second main face opposite to the first main face, such that each of the light receiving sections is exposed; and a process of cutting and individualizing the joined wafer to obtain the image pickup apparatus of a backside irradiation type device.

\* \* \* \* \*